(12) United States Patent
Ono et al.

(10) Patent No.: US 10,892,232 B2
(45) Date of Patent: Jan. 12, 2021

(54) SEMICONDUCTOR DEVICE

(71) Applicant: Toshiba Memory Corporation, Minato-ku (JP)

(72) Inventors: Takanobu Ono, Kuwana (JP); Tsutomu Fujita, Yokkaichi (JP); Ippei Kume, Yokkaichi (JP); Akira Tomono, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/558,544

(22) Filed: Sep. 3, 2019

(65) Prior Publication Data
US 2020/0294934 A1 Sep. 17, 2020

(30) Foreign Application Priority Data
Mar. 15, 2019 (JP) .................. 2019-048945

(51) Int. Cl.
*H01L 29/32* (2006.01)
*H01L 23/00* (2006.01)
*H01L 23/544* (2006.01)
*H01L 21/428* (2006.01)

(52) U.S. Cl.
CPC .......... *H01L 23/562* (2013.01); *H01L 21/428* (2013.01); *H01L 23/544* (2013.01); *H01L 29/32* (2013.01); *H01L 2223/5446* (2013.01)

(58) Field of Classification Search
CPC . H01L 21/268; H01L 21/2683; H01L 21/428; H01L 21/784; H01L 21/822; H01L 23/544; H01L 23/562; H01L 2223/5446; H01L 29/32
See application file for complete search history.

(56) References Cited

U.S. PATENT DOCUMENTS

| | | | |
|---|---|---|---|
| 8,138,450 B2 | 3/2012 | Sakamoto et al. | |
| 8,828,306 B2 | 9/2014 | Uchiyama | |
| 9,566,791 B2 | 2/2017 | Shibata | |
| 2006/0163699 A1 | 7/2006 | Kumakawa et al. | |
| 2009/0121337 A1* | 5/2009 | Abe | H01L 21/565 257/686 |
| 2014/0256068 A1* | 9/2014 | Franklin | H01L 31/18 438/16 |
| 2018/0204808 A1* | 7/2018 | Mariani | H01L 29/7827 |
| 2018/0212100 A1 | 7/2018 | Inoue et al. | |

(Continued)

FOREIGN PATENT DOCUMENTS

| | | |
|---|---|---|
| CN | 102581494 A | 7/2012 |
| JP | 2006-203002 A | 8/2006 |

(Continued)

*Primary Examiner* — Stephen W Smoot
(74) *Attorney, Agent, or Firm* — Oblon, McClelland, Maier & Neustadt, L.L.P.

(57) ABSTRACT

A semiconductor device according to an embodiment includes a semiconductor substrate comprising a first face, and a second face on an opposite side to the first face. A semiconductor element is provided on the first face of the semiconductor substrate. A polycrystalline or non-crystalline first material layer is provided at least on an outer edge of the first face of the semiconductor substrate. A second material layer is provided on the second face of the semiconductor substrate. The second material layer transmits laser light.

18 Claims, 16 Drawing Sheets

1

(56) References Cited

U.S. PATENT DOCUMENTS

| | | | |
|---|---|---|---|
| 2018/0277436 A1* | 9/2018 | Ono | H01L 21/78 |
| 2019/0164833 A1* | 5/2019 | Kirihara | B23K 26/0624 |
| 2020/0058550 A1* | 2/2020 | Ono | B23K 26/0853 |

FOREIGN PATENT DOCUMENTS

| | | | |
|---|---|---|---|
| JP | 2007-13056 A | 1/2007 |
| JP | 2009-135342 A | 6/2009 |
| JP | 2016-134427 A | 7/2016 |

\* cited by examiner

SEMICONDUCTOR DEVICE

CROSS REFERENCE TO RELATED APPLICATIONS

This application is based upon and claims the benefit of priority from the prior Japanese Patent Application No. 2019-048945, filed on Mar. 15, 2019, the entire contents of which are incorporated herein by reference.

FIELD

The embodiments of the present invention relate to a semiconductor device.

BACKGROUND

A laser dicing technology is a technique that enables to modify an inner part of a semiconductor wafer using laser and cleave the semiconductor wafer from the modified part as a starting point. However, because the straight running property of cleavages spreading from the modified part is low, there is a case where a material film provided on a dicing line of the semiconductor wafer is not linearly divided and the division line meanders. When the semiconductor wafer is thinned by a polishing process after the modification with laser, the division line on the material film sometimes further meanders and a crack may reach a device region.

DETAILED DESCRIPTION

Figure 1:
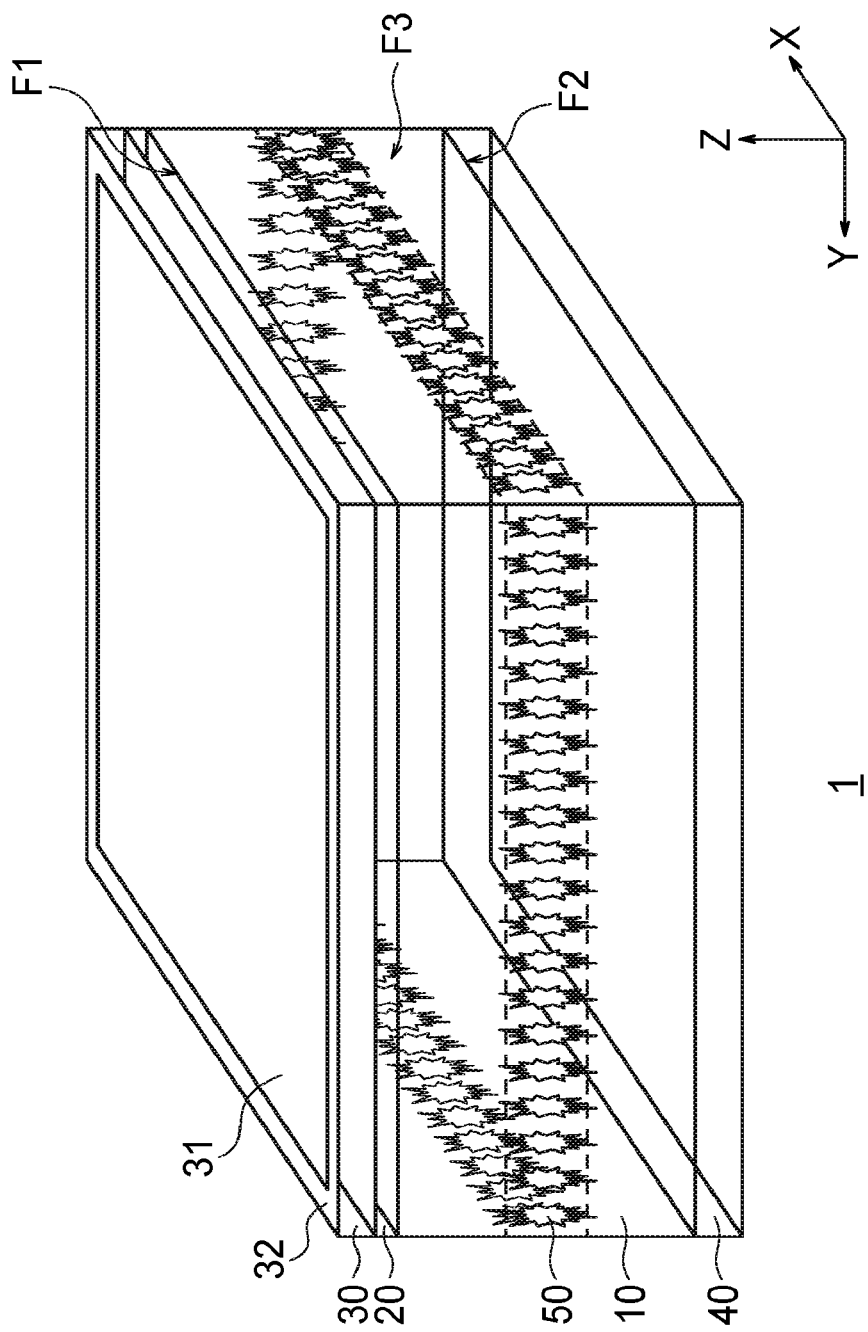
FIG. 1 is a schematic diagram illustrating a configuration example of a semiconductor chip according to a first embodiment.

Embodiments will now be explained with reference to the accompanying drawings. The present invention is not limited to the embodiments. In the embodiments, "an upper direction" or "a lower direction" refers to a relative direction when a direction perpendicular to a top surface or a bottom surface of a semiconductor substrate is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment includes a semiconductor substrate comprising a first face, and a second face on an opposite side to the first face. A semiconductor element is provided on the first face of the semiconductor substrate. A polycrystalline or non-crystalline first material layer is provided at least on an outer edge of the first face of the semiconductor substrate. A second material layer is provided on the second face of the semiconductor substrate. The second material layer transmits laser light.

First Embodiment

FIG. 1 is a schematic diagram illustrating a configuration example of a semiconductor chip according to a first embodiment. A semiconductor chip 1 being a semiconductor device can be, for example, a semiconductor device including a semiconductor memory device such as a NAND flash memory. A memory cell array of the semiconductor memory device can be, for example, a tridimensional memory cell array in which memory cells are three-dimensionally arranged.

The semiconductor chip 1 includes a semiconductor substrate 10, a first material layer 20, a device layer 30, a second material layer 40, and a modified layer 50.

The semiconductor substrate 10 is, for example, a silicon substrate. The semiconductor substrate 10 has a first face F1, and a second face F2 on the opposite side to the first face F1. The semiconductor substrate 10 also has lateral faces F3 provided between the first face F1 and the second face F2. The semiconductor substrate 10 is substantially a cuboid and the lateral faces F3 are provided on four sides of the first and second faces F1 and F2 being quadrangles.

The first material layer 20 is provided on the first face F1 of the semiconductor substrate 10. The first material layer 20 is a polycrystalline material not having a crystal orientation in a specific direction or a non-crystalline material. For example, a single layer of any of polysilicon, amorphous silicon, a silicon dioxide film, a silicon nitride film, diamond-like carbon, an yttrium oxide, a zirconium oxide, an aluminum oxide, tungsten, and molybdenum or a stack layer including two or more thereof is used as the first material layer 20. Alternatively, a mixed material including two or more of the materials described above may be used as the first material layer 20.

The semiconductor substrate 10 has a crystal orientation, for example, in an opposing direction (a Z direction) of the first face F1 and the second face F2 and accordingly a crack is likely to extend in the Z direction from the modified layer 50 in a dicing process. In contrast thereto, because the materials described above of the first material layer 20 do not have a crystal orientation in a specific direction, extension of a crack stops at the first material layer 20 even if a crack extends from the modified layer 50. That is, the first material layer 20 functions as a reinforcing film that suppresses extension of a crack occurring from the modified layer 50 of the semiconductor substrate 10 to the device layer 30.

Normally, the modified layer 50 is formed in an inner part of dicing regions of a semiconductor wafer using laser light of an infrared region (from 800 nanometers to 2500 nanometers) in the laser dicing process. Thereafter, in an expansion process, the semiconductor wafer is entirely pulled in a direction outward from the center on an expansion tape, thereby cleaving the semiconductor wafer at one time from the modified layer 50 as a starting point. At this time, the semiconductor wafer is cleaved substantially linearly in the dicing regions.

However, when the modified layer 50 is formed by irradiating the dicing regions of the semiconductor wafer with later light, there is a case where cleavages from the modified layer 50 easily extend due to impact on the semiconductor wafer before the expansion process and a crack further reaches the surfaces of the dicing regions.

Although not meandering so much in a monocrystalline material having a crystal orientation such as the semiconductor substrate 10, this crack sometimes meanders in a passivation film or the like formed on the semiconductor substrate 10. Such meandering of the crack reduces the reliability of the semiconductor chip 1. Furthermore, if a crack reaches an element formation portion 31 of the device layer 30, the semiconductor chip 1 becomes defective. For example, a crack from the modified layer 50 is likely to reach the device layer 30 in a thinned semiconductor wafer and careful handling is particularly required.

According to the present embodiment, the semiconductor chip 1 has the first material layer 20 entirely on the first face F1 including the outer edge thereof and the device layer 30 is provided on the first material layer 20. That is, the first material layer 20 serving as a reinforcing film is provided between the semiconductor substrate 10 and the device layer 30. Accordingly, a crack from the modified layer 50 is suppressed from extending to the device layer 30 before the expansion process. In a CMOS formation region, the first material layer 20 is removed and a CMOS is formed on the device layer 30. The first material layer 20 is left on the device layer 30 in other regions.

The second material layer 40 is provided on the second face F2 of the semiconductor substrate 10. The second material layer 40 is a material through which laser light to be used in the dicing process can transmit and that has a Young's modulus higher than that of the semiconductor substrate 10. For example, a single layer of any of a silicon nitride film, diamond-like carbon, an yttrium oxide, a zirconium oxide, and an aluminum oxide or a stack layer including two or more thereof is used as the second material layer 40. Alternatively, a mixed material including two or more of the materials described above may be used as the second material layer 40.

The materials described above of the second material layer allow transmission of laser light of an infrared region therethrough, the laser light having a wavelength from 800 nanometers to 2500 nanometers. The transmittance of laser light of the infrared region is about 53% in the silicon nitride film, about 67% in the zirconium oxide, and about 90% in the aluminum oxide. While the transmittance of laser light thus differs according to the materials, the transmittance of laser light of the second material layer 40 is preferably equal to or higher than about 25%.

In the dicing process, the laser light enters from the second face F2 of the semiconductor substrate 10 and forms the modified layer 50 in the dicing regions of the semiconductor substrate 10. At this time, if the second material layer 40 provided on the second face F2 does not allow transmission of the laser light therethrough, the second material layer 40 absorbs the laser light and the modified layer 50 is not formed. Therefore, it is preferable that the second material layer 40 be a material that allows transmission of laser light therethrough at least to an extent that the modified layer 50 can be formed.

The Young's modulus of silicon single crystal is about 185 GPa. In contrast thereto, the Young's moduli of the materials described above of the second material layer 40 are higher than 185 GPa. For example, the Young's modulus of a silicon nitride film is 280 GPa to 300 GPa, the Young's modulus of diamond-like carbon is 185 GPa to 800 GPa, the Young's modulus of a zirconium oxide is about 210 GPa, and the Young's modulus of an aluminum oxide is 350 GPa to 390 GPa. It is thus preferable that the second material layer 40 be harder than the semiconductor substrate 10 (silicon single crystal). Due to the second material layer 40 being harder than the semiconductor substrate 10, extension of a crack to an inner portion of the second material layer 40 is suppressed even if the modified layer 50 is formed in the semiconductor substrate 10 in the dicing process. That is, the second material layer 40 functions as a reinforcing film that suppresses extension of a crack occurring from the modified layer 50 of the semiconductor substrate 10.

As described above, the first material layer 20 on the first face F1 suppresses extension of a crack and the second material layer 40 on the second face F2 suppresses extension of a crack. Accordingly, a crack from the modified layer 50 can remain within the semiconductor substrate 10 until the semiconductor wafer is expanded in the expansion process. Thereafter, the semiconductor wafer is expanded in the expansion process, whereby a crack from the modified layer 50 extends in a substantially vertical direction (Z direction) to the first and second material layers 20 and 40 and a dicing portion 32 of the device layer 30. In the expansion process, a crack extends substantially linearly to the first and second material layers 20 and 40 and the dicing portion 32 of the device layer 30. That is, according to the present embodiment, the straight running property of a crack spreading from the modified layer 50 can be improved. This enhances the reliability of the semiconductor chip 1 cut from the semiconductor wafer.

The device layer 30 is provided on the first material layer 20. The device layer 30 includes the element formation portion 31 where semiconductor elements (not illustrated) are placed, and the dicing portion 32 provided around the element formation portion 31 (on the outer edge of the semiconductor chip 1). The semiconductor elements formed on the element formation portion 31 are covered and protected by an insulating film such as a passivation film. No semiconductor elements are formed on the dicing portion 32 and an insulating film is provided thereon.

The modified layer 50 extends on the lateral faces F3 of the semiconductor chip 1 in a substantially orthogonal direction (an X or Y direction) to the Z direction. The modified layer 50 is formed in an intermittent manner by pulsed laser light and is formed in the X or Y direction along the dicing region. While being formed in an intermittent manner, portions of the modified layer 50 thus formed join together in the X or Y direction to become substantially a layer. Because the first material layer 20 is a polycrystalline material or a non-crystalline material, reflection light of the laser light is likely to be scattered. Therefore, a modified layer caused by the reflection light from the first material layer 20 is unlikely to be formed in portions other than the modified layer 50.

The laser dicing process is explained next.

FIGS. 2 to 9 are schematic diagrams illustrating the dicing process. In FIGS. 3 to 9, the semiconductor substrate 10 is illustrated with the second face F2 facing upward for the convenience sake.

Figure 2:
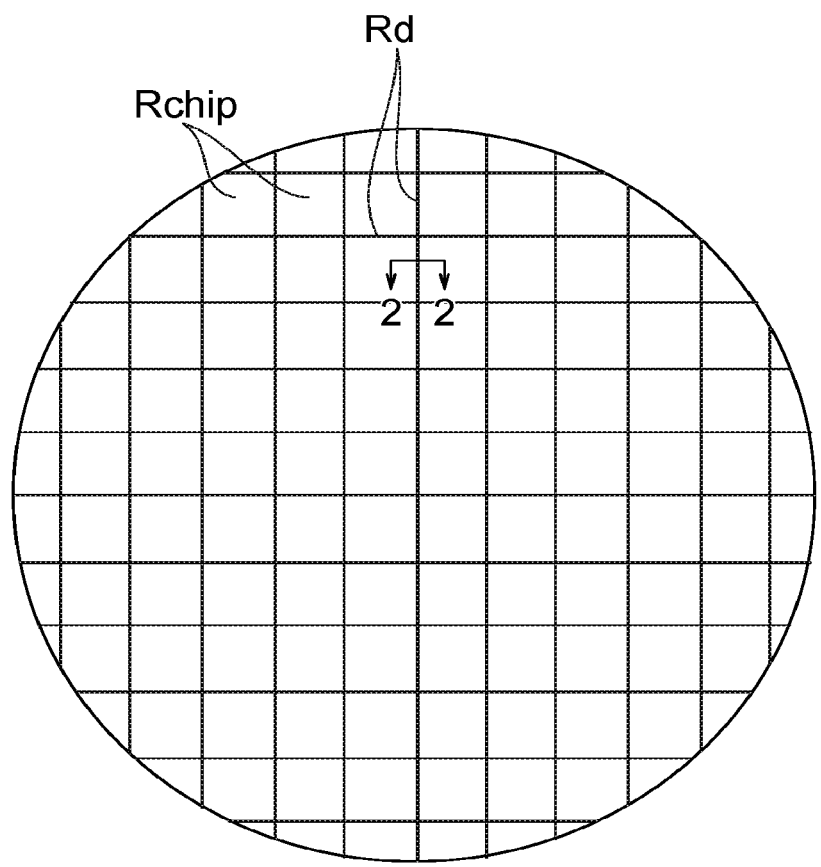
FIGS. 2 to 9 are schematic diagrams illustrating the dicing process.

FIG. 2 is a plan view illustrating a semiconductor wafer W. As illustrated in FIG. 2, the semiconductor wafer W has a plurality of chip regions Rchip each becoming the semiconductor chip 1, and a plurality of dicing regions Rd to be cut in the dicing process. Semiconductor elements are formed in the chip regions Rchip through a semiconductor manufacturing process. Further, the semiconductor elements are covered by an insulating film such as a passivation film 33. For example, polyimide is used as the passivation film 33. The dicing regions Rd are linear regions between adjacent ones of the chip regions Rchip and are regions (dicing lines) to be cut by dicing.

Figure 3:
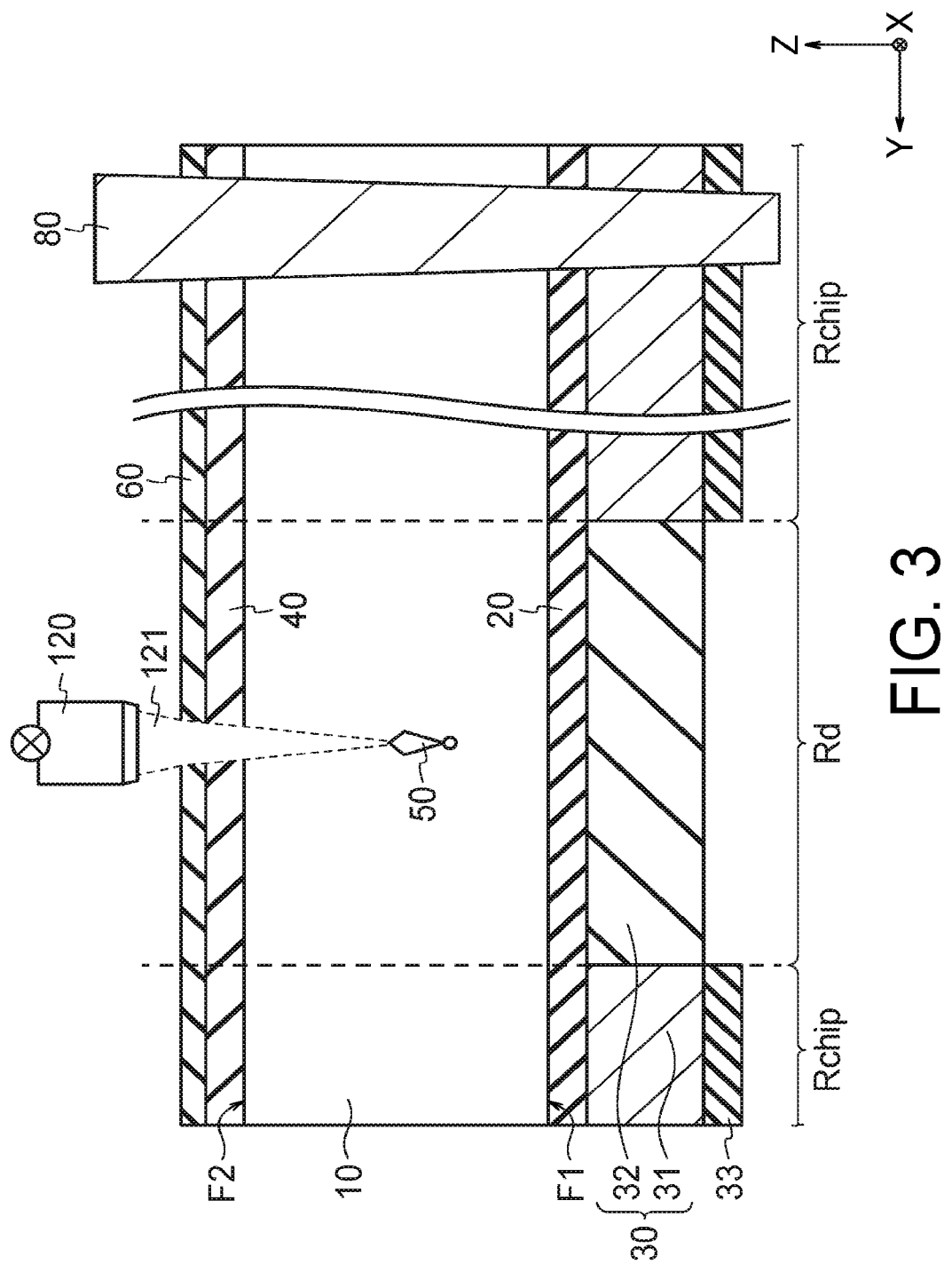
Figure 4:
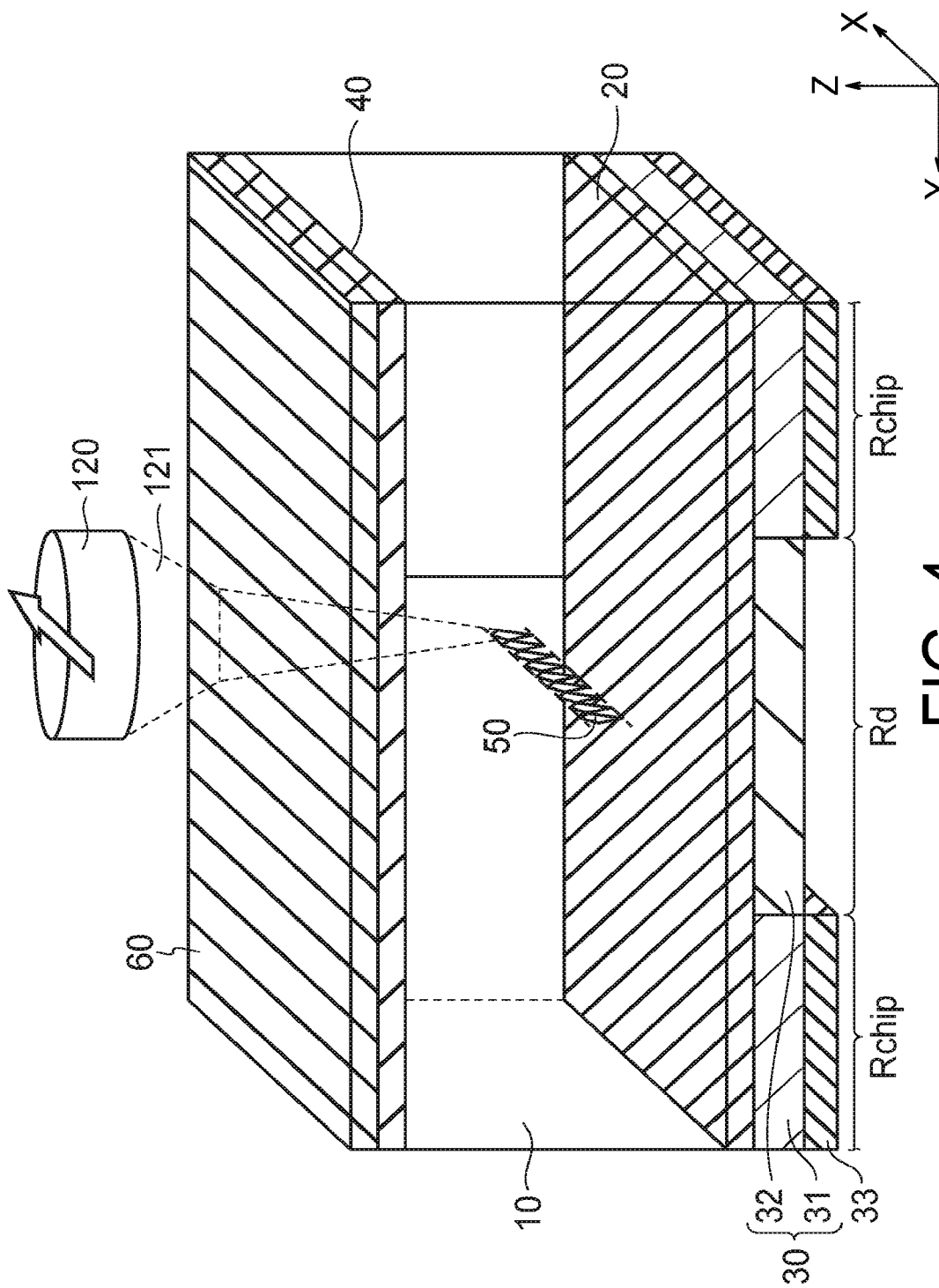

FIGS. 3 and 4 are diagrams illustrating a manner in which laser light is applied. FIG. 3 corresponds to a cross-section along a line 2-2 in FIG. 2. The first material layer 20 is provided on the first face F1 of the semiconductor substrate 10 and the device layer 30 is provided on the first material layer 20. In the present embodiment, the first material layer 20 is provided on the entire first face F1. The device layer 30 includes the element formation portion 31 provided in the chip regions Rchip and the dicing portion 32 provided in the dicing regions Rd. Illustrations of the semiconductor elements on the element formation portion 31 are omitted. The passivation film 33 is provided on the element formation portion 31. No semiconductor elements are provided on the dicing portion 32 and an insulating film (a silicon dioxide film) including a passivation film is provided thereon.

Meanwhile, the second material layer 40 is provided on the second face F2 of the semiconductor substrate 10. The second material layer 40 is provided on the entire second face F2. An insulating film 60 such as a silicon dioxide film may be provided on the second material layer 40. The insulating film 60 is formed to be thin so as not to affect the transmittance of laser light of the second material layer 40. In this way, the first and second material layers 20 and 40 are provided on the first and second faces F1 and F2 of the semiconductor substrate 10, respectively.

Through silicon vias (TSVs) 80 may be further provided on the semiconductor chip 1. The through silicon vias 80 are electrodes extending through the semiconductor substrate 10 from the second face F2 to the first face F1. The through silicon vias 80 are provided to electrically connect interconnections of another semiconductor chip or a mounting board (not illustrated) placed on the side of the second face F2 to the semiconductor elements of the device layer 30. The through silicon vias 80 are formed after the first and second material layers 20 and 40, the passivation film 33, and the insulating film 60 are formed and the semiconductor wafer W is thinned by CMP (Chemical Mechanical Polishing) or the like.

Next, in the dicing process, a protection tape (not illustrated) for dicing is attached onto the front surface of the semiconductor wafer W. Alternatively, the semiconductor wafer W is bonded onto a dicing tape having an adhesive layer and the dicing tape is fixed with a ring (not illustrated).

Next, as illustrated in FIGS. 3 and 4, portions corresponding to the dicing regions Rd are irradiated with laser light 121 from the second face (the rear surface) F2 of the semiconductor wafer W using a laser oscillator 120. Accordingly, the modified layer 50 is formed inside the semiconductor wafer W.

The laser oscillator 120 performs, for example, pulse irradiation with the laser light 121 while moving in the X direction. Accordingly, the modified layer 50 is formed in the X direction along a dicing region Rd in an intermittent manner. While being formed in an intermittent manner, these portions of the modified layer 50 join together in the X direction and become substantially a layer. In a dicing region Rd extending in the Y direction, the laser oscillator 120 performs pulse irradiation with the laser light 121 while moving in the Y direction and forms the modified layer 50 in the Y direction.

Figure 5:
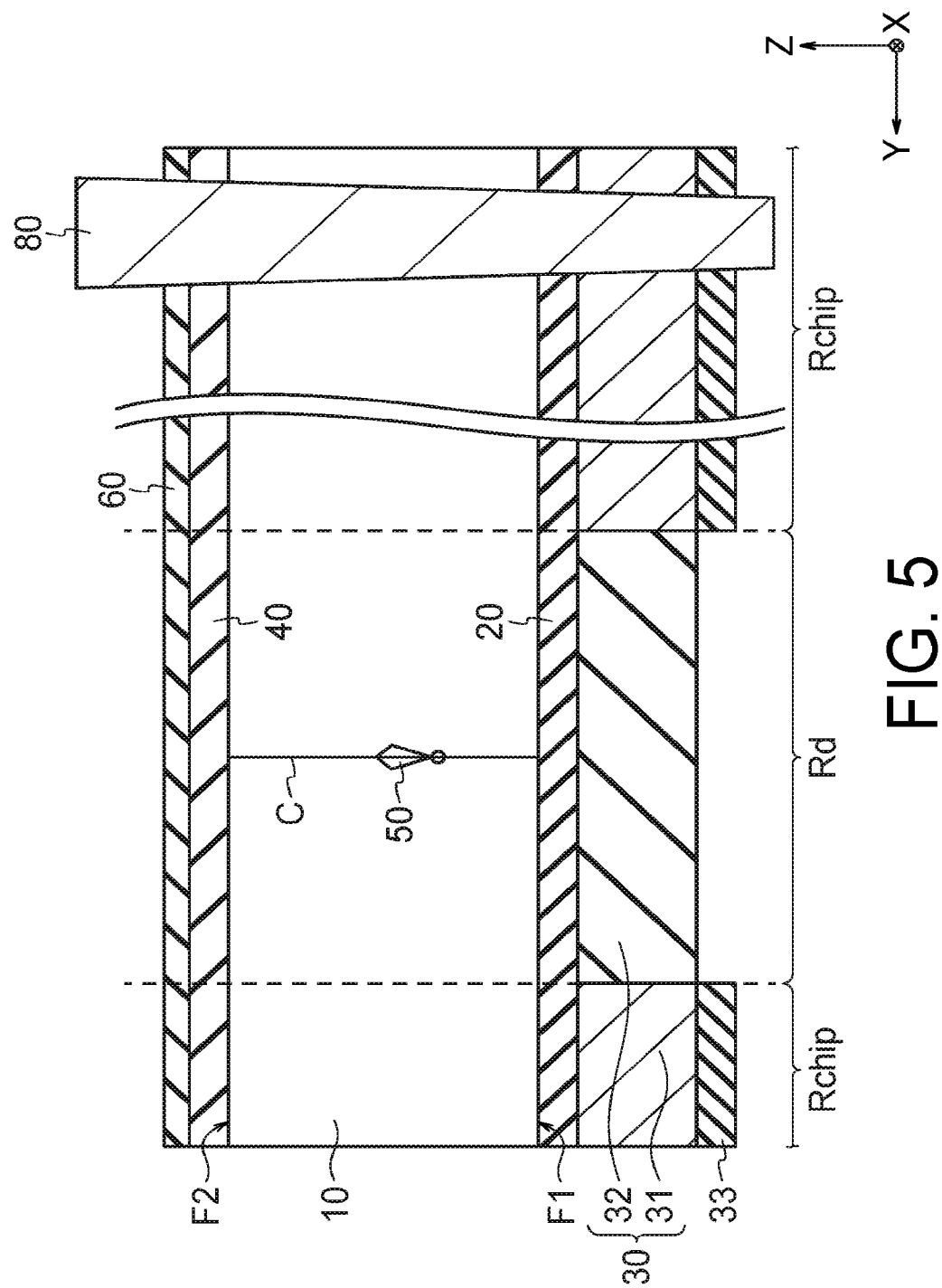
Figure 6:
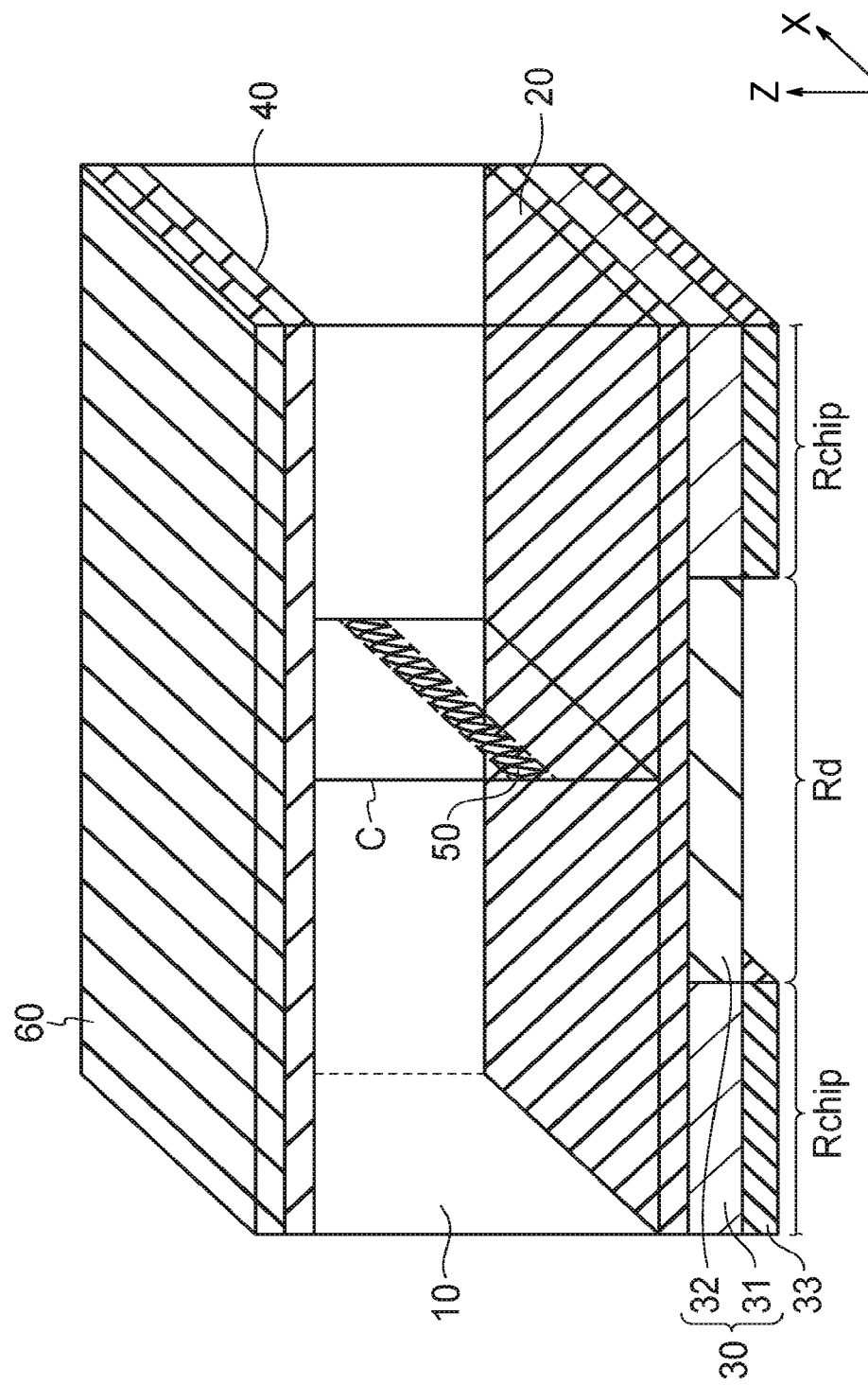

A crack C from the modified layer 50 as a starting point sometimes extends in the semiconductor substrate 10 as illustrated in FIGS. 5 and 6 depending on handing of the semiconductor substrate 10 after formation of the modified layer 50. FIGS. 5 and 6 are diagrams illustrating extension of a crack. The semiconductor substrate 10 is protected by the first and second material layers 20 and 40 on the first and second faces F1 and F2. Therefore, the crack C remains within the semiconductor substrate 10 and cleaves substantially linearly in the Z direction. Also in the extension direction (the X direction or the Y direction) of the dicing region Rd, the crack C extends linearly almost without meandering in the semiconductor substrate 10.

Figure 7:
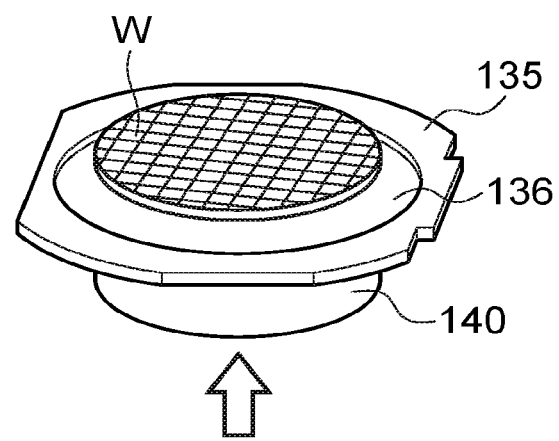

Next, FIG. 7 is a diagram illustrating the expansion process. As illustrated in FIG. 7, the semiconductor wafer W is bonded onto a dicing tape 136 having an adhesive layer and the dicing tape 136 is fixed with a ring 135. Next, the dicing tape 136 is pushed upward from below with a push-up member 140 to stretch (expand) the dicing tape 136. Accordingly, the semiconductor wafer W is stretched outward along with the dicing tape 136. At this time, the semiconductor wafer W is cleaved along the modified layer 50 to singulate a plurality of semiconductor chips.

Figure 8:
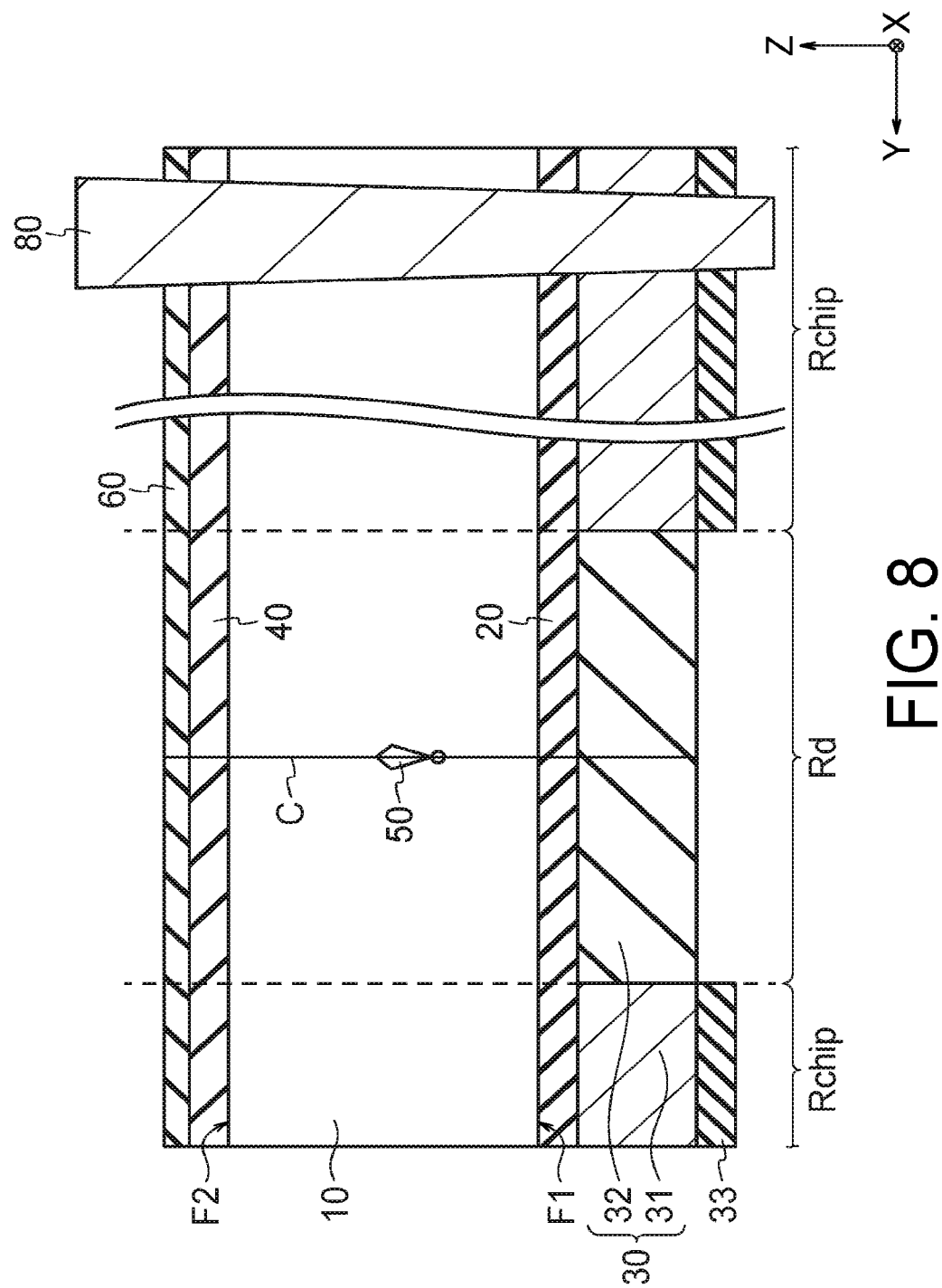
Figure 9:
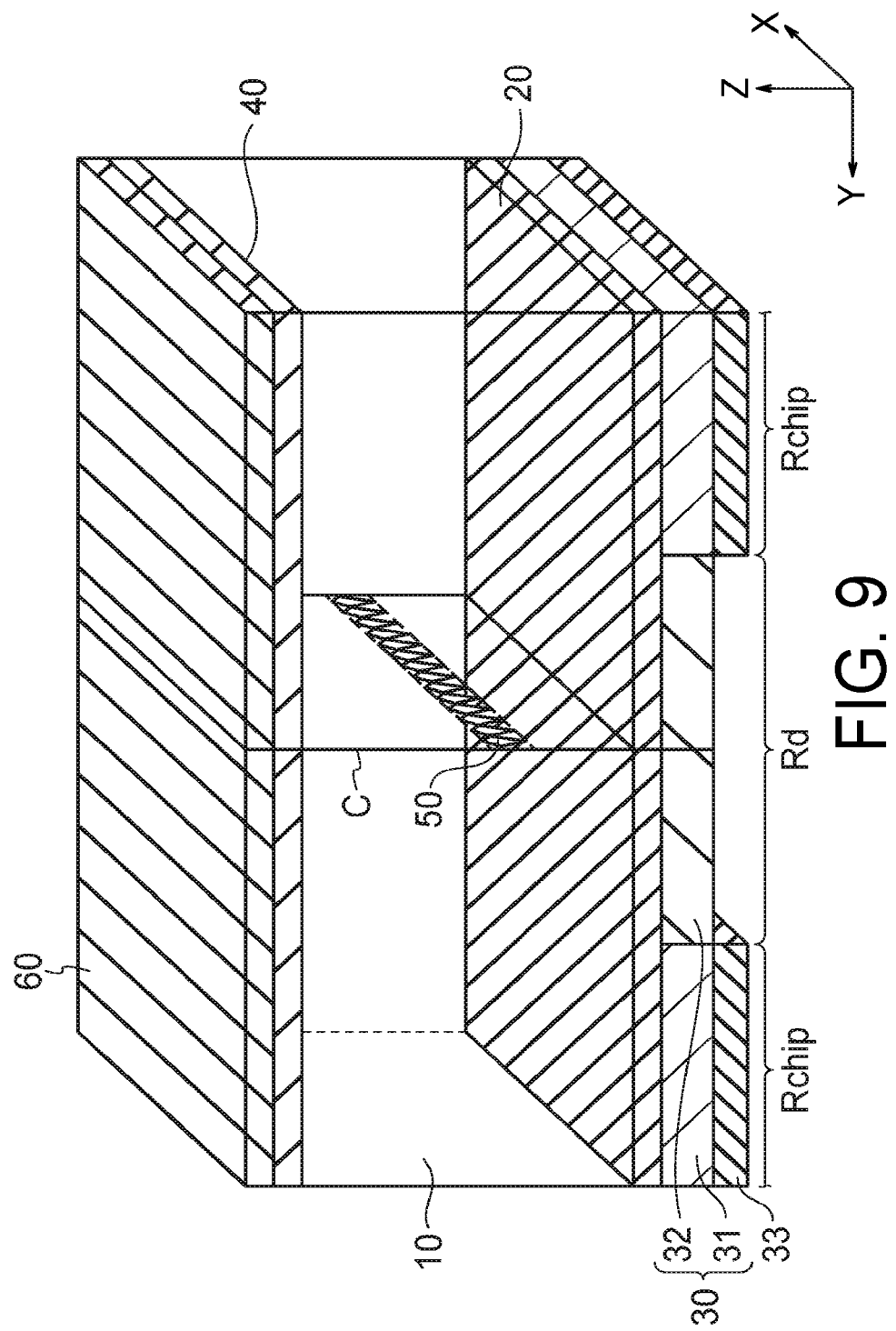

At this time, the first and second material layers 20 and 40 are cut substantially linearly in the Z direction along the modified layer 50 and/or the crack C as illustrated in FIGS. 8 and 9. FIGS. 8 and 9 are diagrams illustrating a manner in which a crack is formed between semiconductor chips by expansion. The first and second material layers 20 and 40 are cut substantially linearly in the X direction or the Y direction along the dicing regions Rd.

In this way, according to the present embodiment, with provision of the first and second material layers 20 and 40 on the first and second faces F1 and F2 of the semiconductor substrate 10, a crack from the modified layer 50 is suppressed from extending to the device layer 30 before the expansion process. There is no problem if the crack C extends to the middle of the first and second material layers 20 and 40 as long as the crack C does not extend to the device layer 30 before the expansion process.

Thereafter, the semiconductor wafer W is expanded in the expansion process, whereby the crack C from the modified layer 50 is extended to the first and second material layers 20 and 40 and the dicing portion 32 of the device layer 30. In the expansion process, the semiconductor substrate 10 is expanded in such a manner that the crack C extends substantially linearly in the Z direction and along the dicing regions Rd. Therefore, the crack C extends substantially linearly in the first and second material layers 20 and 40 and the dicing portion 32 of the device layer 30. That is, the modified layer 50 and the crack C before the expansion process just function as starting points of division at the time of expansion, and provide external force in the expansion process to cut also the first and second material layers 20 and 40. As a result, the present embodiment can improve the straight running property of the crack C from the modified layer 50 and can suppress improper extension of the crack C to the element formation portion 31.

Second Embodiment

Figure 10:
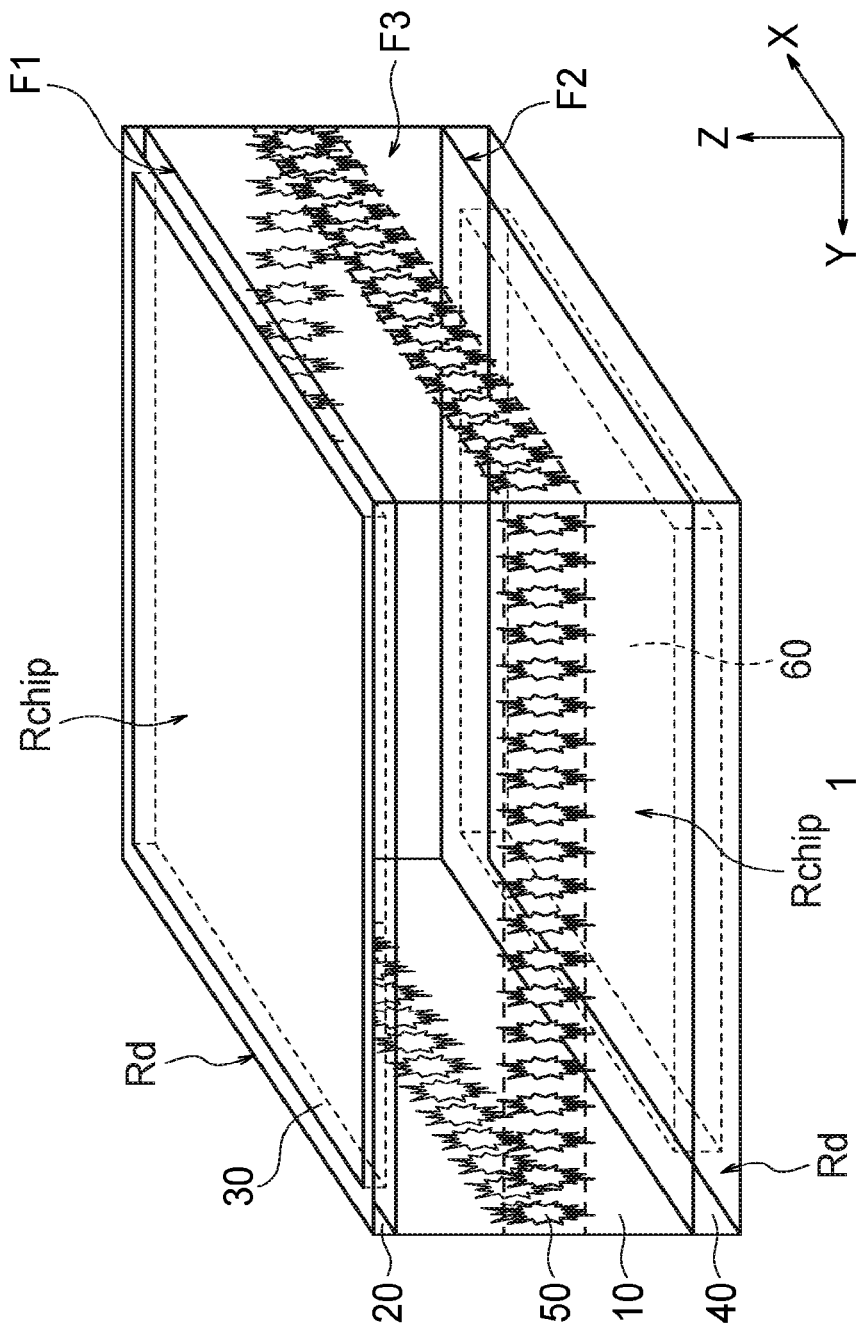
FIG. 10 is a schematic diagram illustrating a configuration example of a semiconductor chip according to a second embodiment.

FIG. 10 is a schematic diagram illustrating a configuration example of a semiconductor chip according to a second embodiment. In the second embodiment, the first and second material layers 20 and 40 are provided only in the dicing regions Rd and are not provided in the chip regions Rchip. That is, on the first face F1 of the semiconductor substrate 10, the element formation portion 31 of the device layer 30 is provided on the semiconductor substrate 10 and the first material layer 20 is not provided thereunder in the chip regions Rchip. On the second face F2 of the semiconductor substrate 10, the insulating film 60 including the passivation film 33 is provided on the semiconductor substrate 10 and the second material layer 40 is not provided thereunder in the chip regions Rchip. In other words, the first material layer 20 is provided around (on the outer edge of) the element formation portion 31 in the chip regions Rchip. The second material layer 40 is provided around (on the outer edge of) the insulating film 60 in the chip regions Rchip.

In this way, the first and second material layers 20 and 40 do not need to be provided entirely on the first and second faces F1 and F2, respectively, and can be provided only in the dicing regions Rd. In this case, the first and second material layers 20 and 40 can reinforce at least the dicing regions Rd while the entire semiconductor substrate 10 cannot be reinforced. Accordingly, The second embodiment can also obtain identical effects as those of the first embodiment.

FIGS. 11 to 16 are schematic diagrams illustrating the dicing process. In the second embodiment, the semiconductor chips 1 are singulated out of the semiconductor wafer W illustrated in FIG. 2 similarly to the first embodiment.

Figure 11:
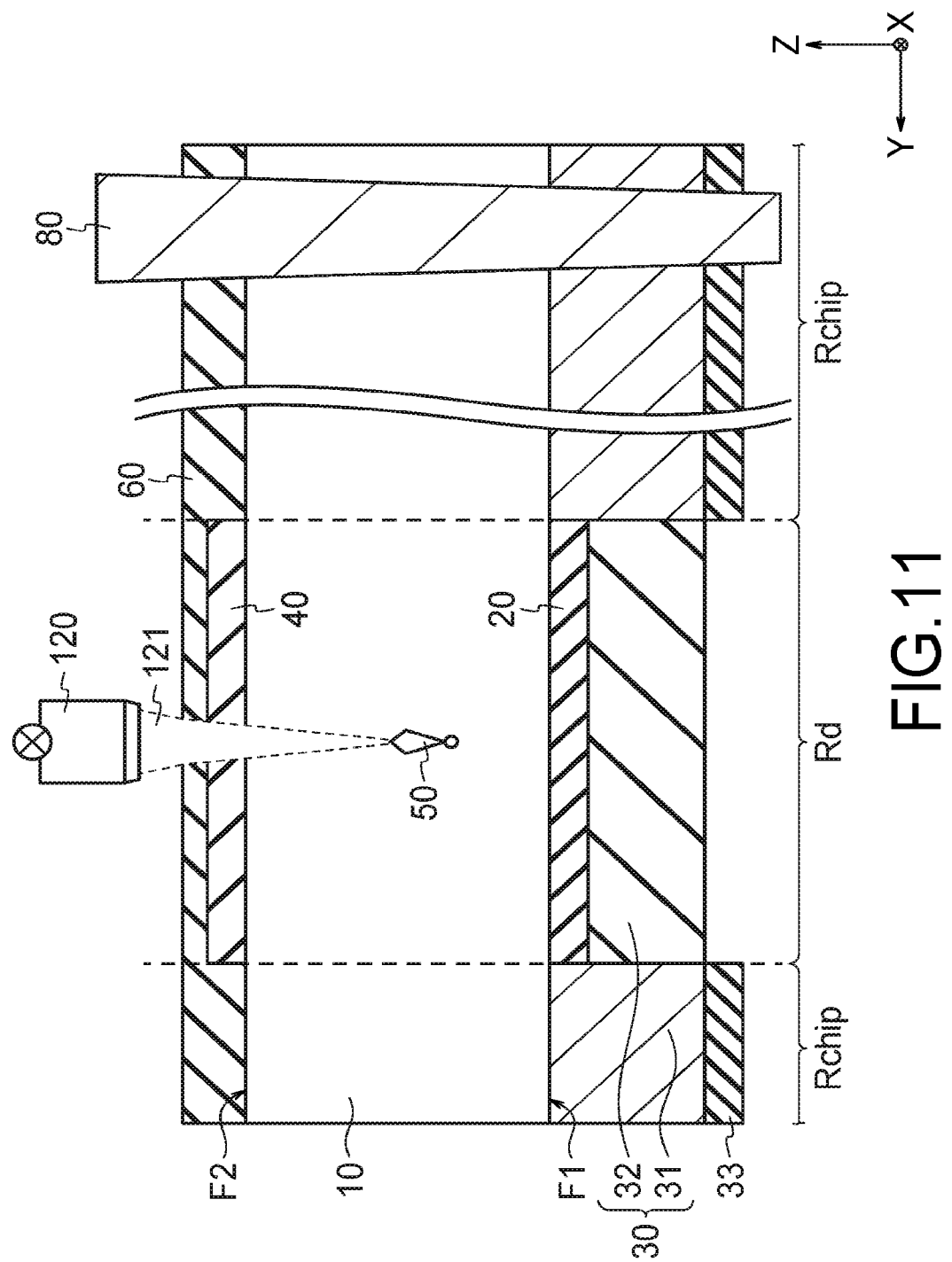
FIGS. 11 to 16 are schematic diagrams illustrating the dicing process.
Figure 12:
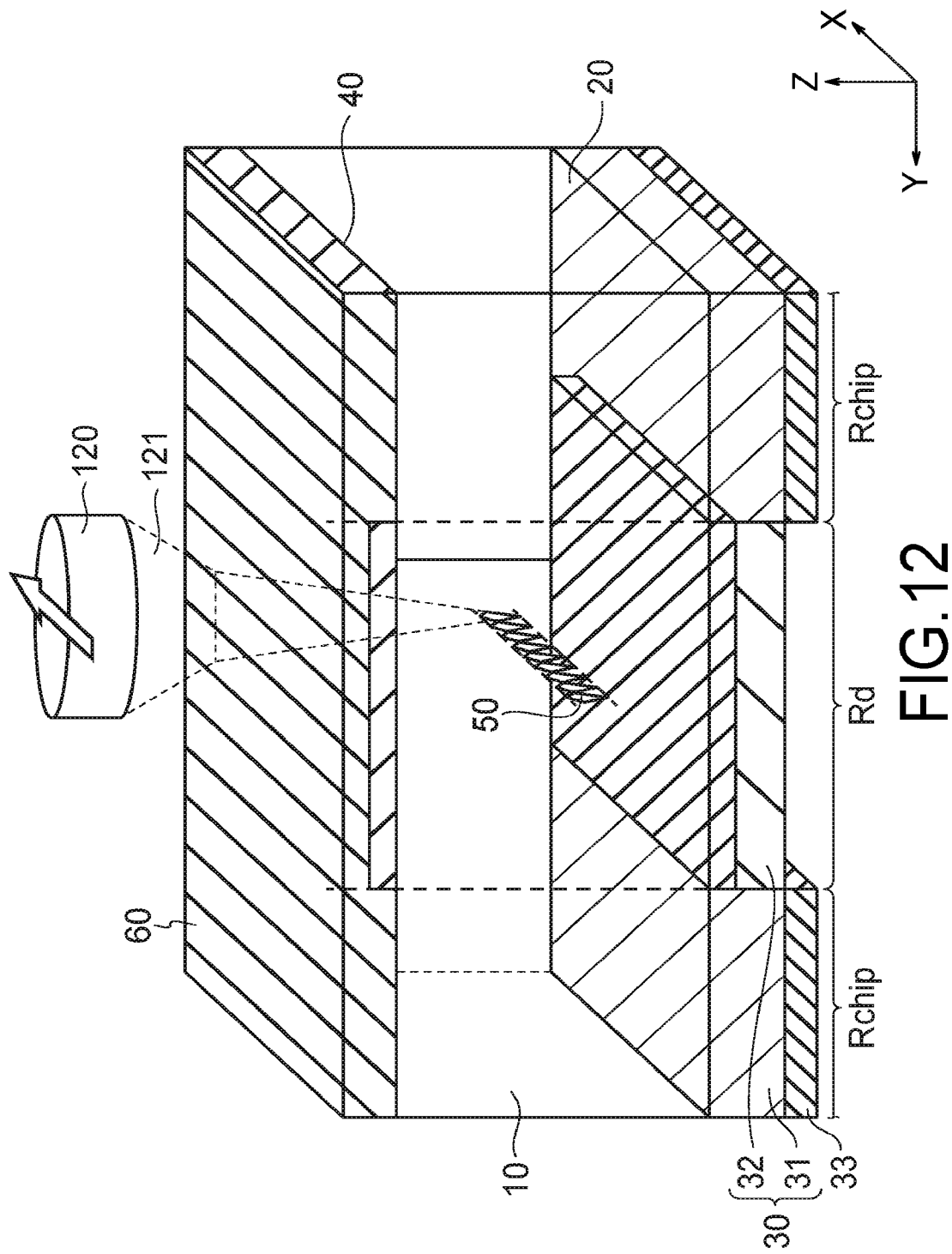

FIGS. 11 and 12 are diagrams illustrating a manner in which laser light is applied. The first and second material layers 20 and 40 are provided only in the dicing regions Rd and are not provided in the chip regions Rchip. The laser oscillator 120 irradiates portions of the semiconductor wafer W corresponding to the dicing regions Rd with the laser light 121 from the second face F2 similarly to the first embodiment. Accordingly, the modified layer 50 is formed inside the semiconductor wafer W.

Figure 13:
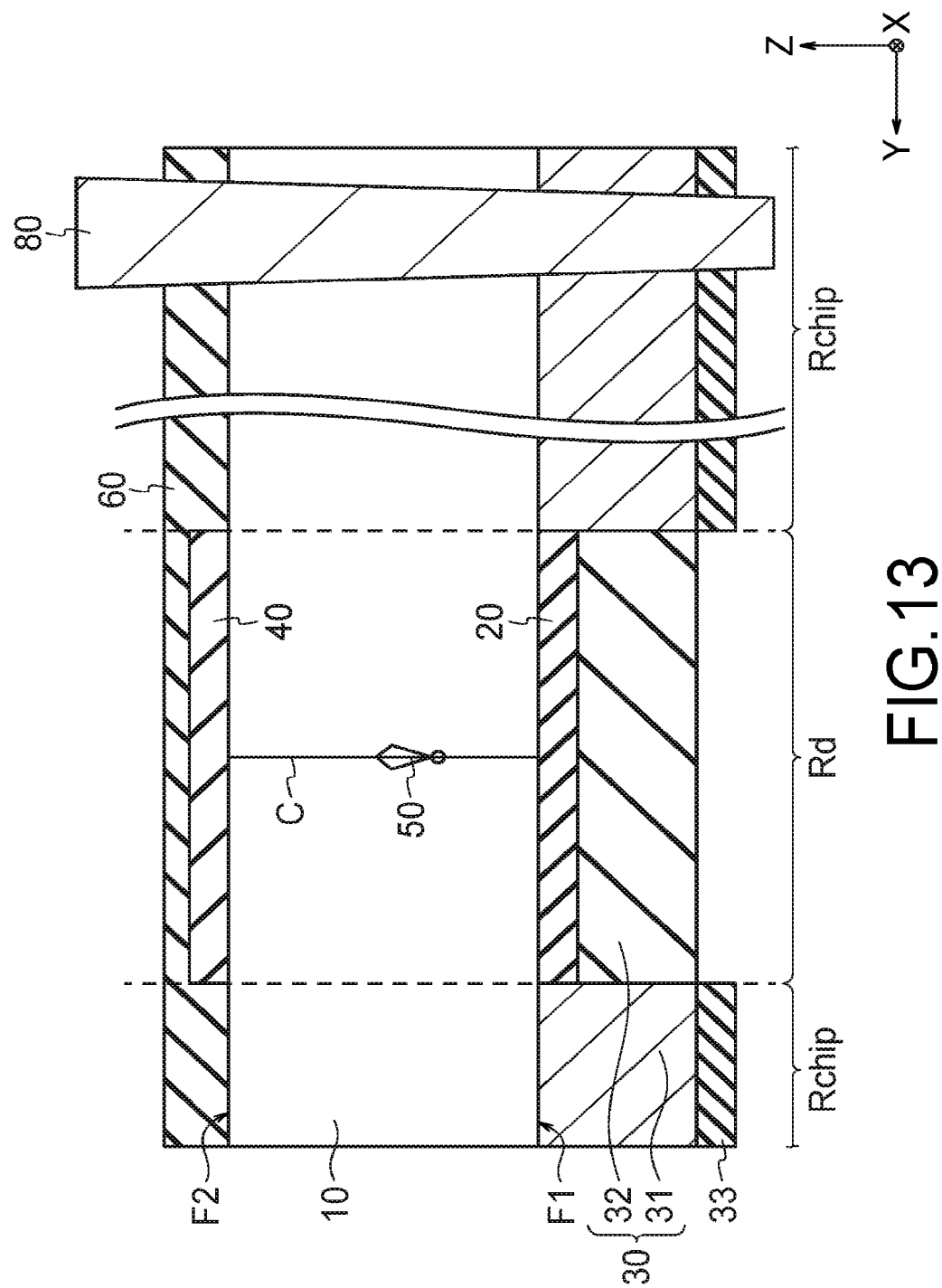
Figure 14:
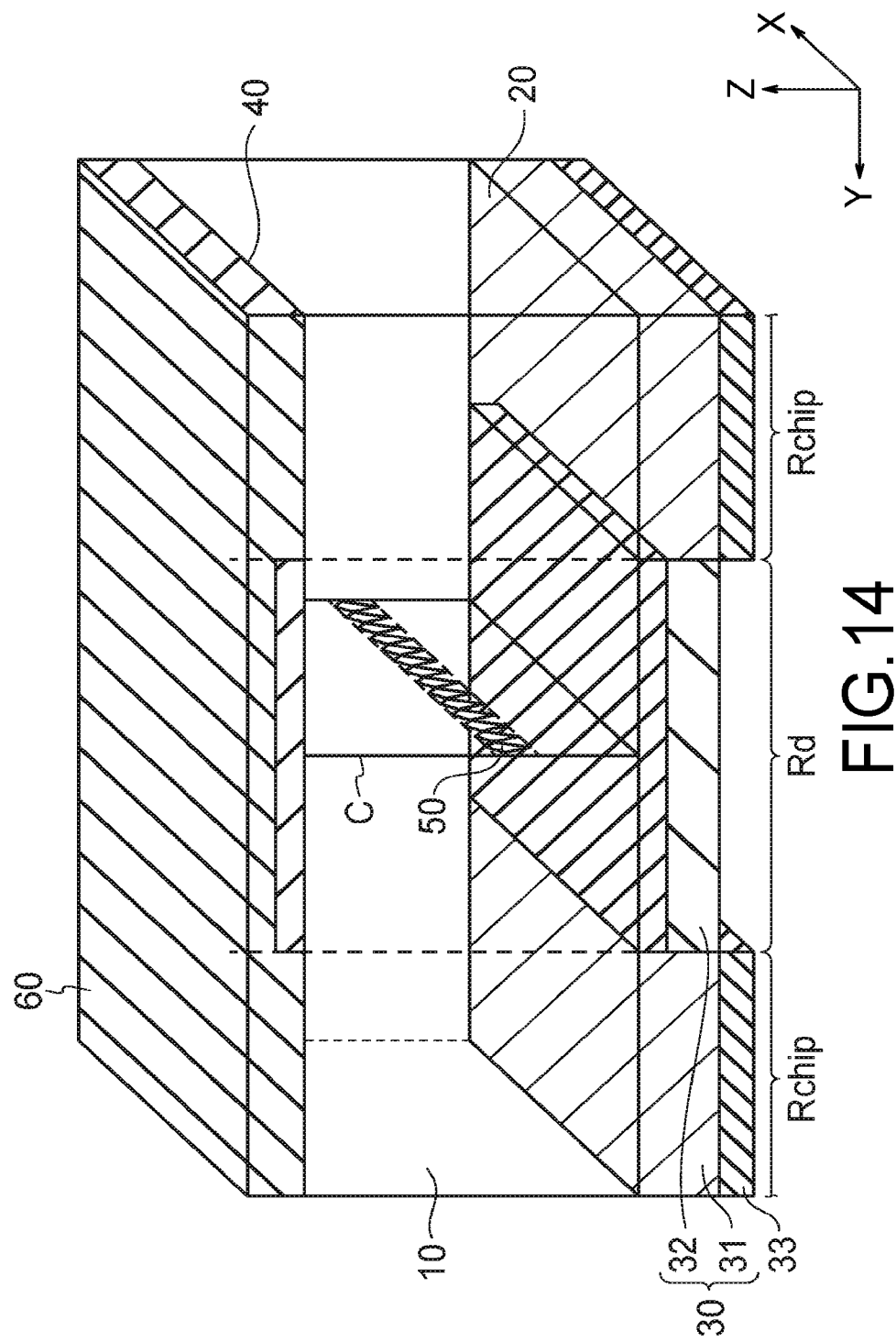

A crack C from the modified layer 50 as a starting point sometimes extends in the semiconductor substrate 10 as illustrated in FIGS. 13 and 14 depending on handling of the semiconductor substrate 10 after formation of the modified layer 50. FIGS. 13 and 14 are diagrams illustrating extension of a crack. In this example, the dicing regions Rd of the semiconductor substrate 10 are protected by the first and second material layers 20 and 40 on the first and second faces F1 and F2. It does not matter whether or not a crack extends to the second material layer 40 on the second face F2. In either case, the crack C accordingly remains within the semiconductor substrate 10 on the first face F1 and cleaves substantially linearly in the Z direction. Therefore, the crack C remains within the semiconductor substrate 10 and cleaves substantially linearly in the Z direction. Also in the extension direction (the X direction or the Y direction) of the dicing regions Rd, the crack C extends linearly almost without meandering.

Next, as explained with reference to FIG. 7, the semiconductor wafer W is expanded to singulate a plurality of semiconductor chips.

Figure 15:
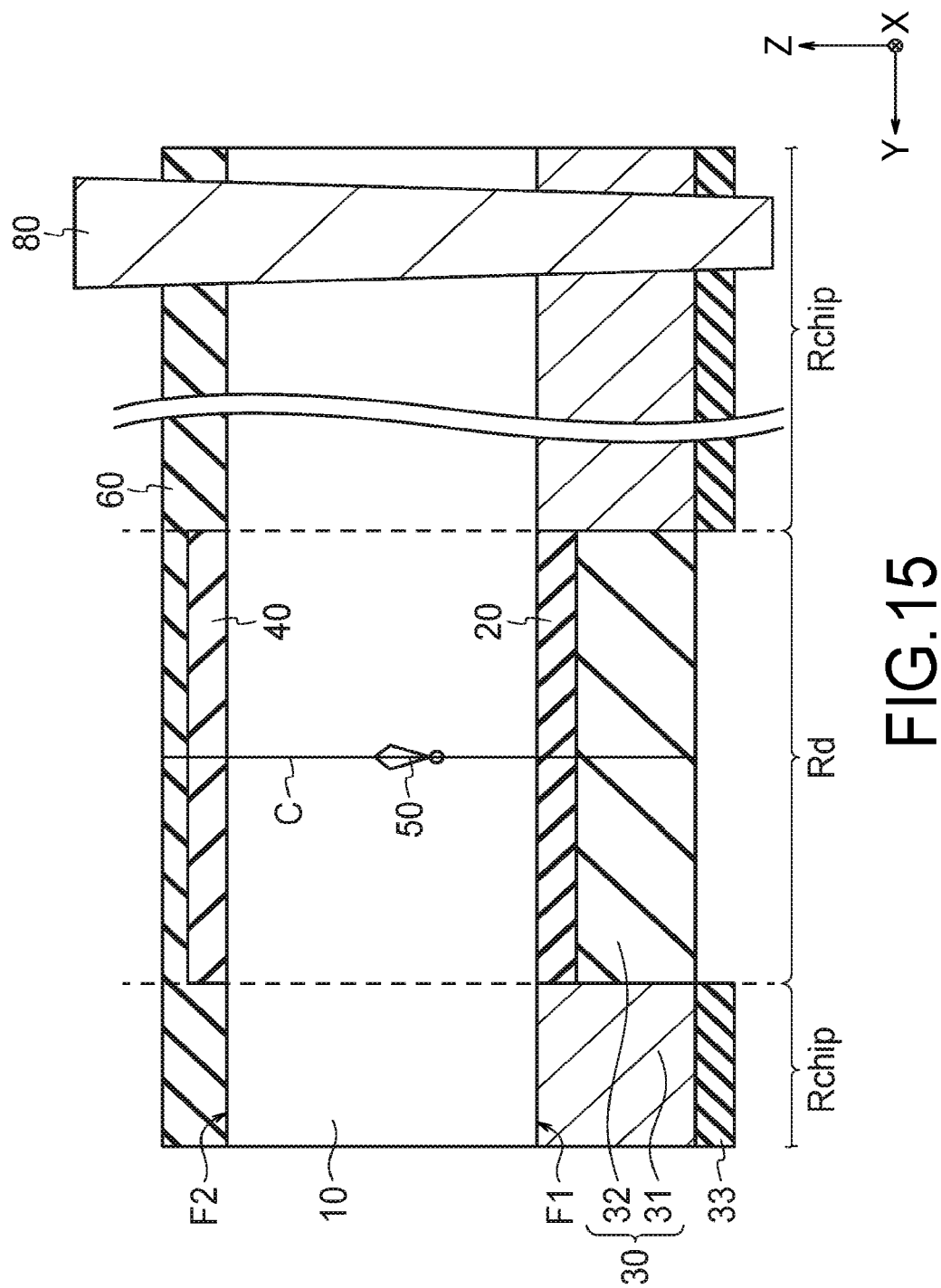
Figure 16:
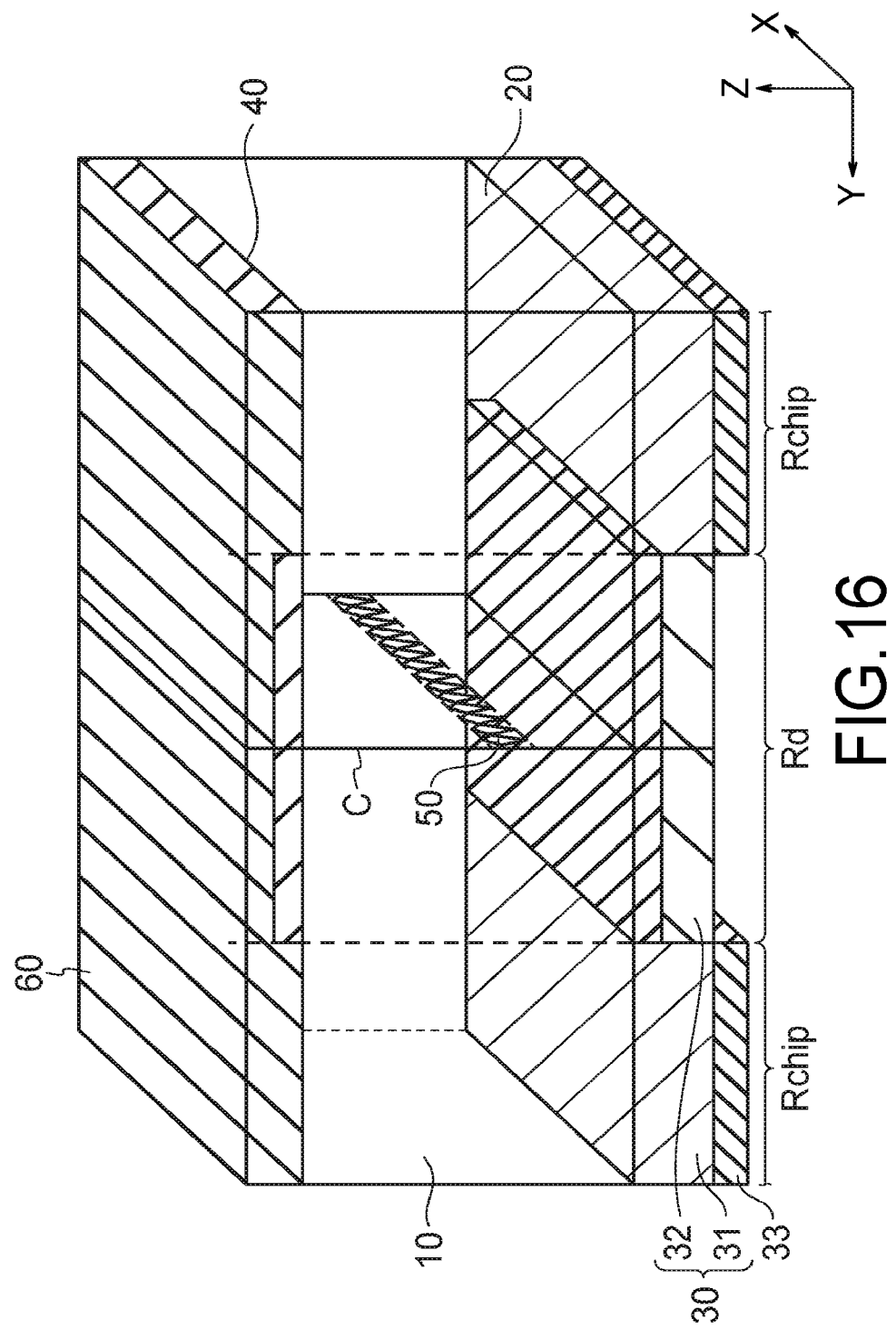

At this time, the first and second material layers 20 and 40 are cut substantially linearly in the Z direction along the modified layer 50 and/or the crack C as illustrated in FIGS. 15 and 16. FIGS. 15 and 16 are diagrams illustrating a manner in which a crack is formed between semiconductor chips by expansion. The first and second material layers 20 and 40 are cut substantially linearly in the X direction or the Y direction along the dicing regions Rd.

In this way, the straight running property of the crack C from the modified layer 50 can be improved and improper extension of the crack C to the element formation portion 31 can be suppressed even with the first and second material layers 20 and 40 provided only in the dicing regions Rd.

(Modification)

The first and second material layers 20 and 40 in the first and second embodiments may be appropriately combined with each other. For example, the first material layer 20 in the first embodiment and the second material layer 40 in the second embodiment may be combined with each other. Conversely, the first material layer 20 in the second embodiment and the second material layer 40 in the first embodiment may be combined with each other. The effects of the present embodiment are not lost even with such a modification.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate comprising a first face, and a second face on an opposite side to the first face;
   a semiconductor element provided on the first face of the semiconductor substrate;
   a polycrystalline or non-crystalline first material layer provided at least on an outer edge of the first face of the semiconductor substrate; and
   a second material layer provided on the second face of the semiconductor substrate, the second material layer transmitting laser light.

2. The device of claim 1, wherein the first material layer is provided also between the semiconductor element and the semiconductor substrate.

3. The device of claim 2, wherein the first material layer includes any of polysilicon, amorphous silicon, a silicon dioxide film, a silicon nitride film, diamond-like carbon, an yttrium oxide, a zirconium oxide, an aluminum oxide, tungsten, and molybdenum.

4. The device of claim 2, wherein the second material layer transmits of laser light, the laser light having a wavelength of 800 nanometers to 2500 nanometers.

5. The device of claim 2, wherein the second material layer is higher in a Young's modulus than the semiconductor substrate.

6. The device of claim 2, wherein the second material layer includes any of a silicon nitride film, diamond-like carbon, an yttrium oxide, a zirconium oxide, and an aluminum oxide.

7. The device of claim 2, wherein a single modified layer resulting from the laser light is provided on lateral faces of the semiconductor substrate between the first face and the second face.

8. The device of claim 1, wherein the first material layer includes any of polysilicon, amorphous silicon, a silicon dioxide film, a silicon nitride film, diamond-like carbon, an yttrium oxide, a zirconium oxide, an aluminum oxide, tungsten, and molybdenum.

9. The device of claim 8, wherein the second material layer transmits of laser light, the laser light having a wavelength of 800 nanometers to 2500 nanometers.

10. The device of claim 8, wherein the second material layer is higher in a Young's modulus than the semiconductor substrate.

11. The device of claim 8, wherein the second material layer includes any of a silicon nitride film, diamond-like carbon, an yttrium oxide, a zirconium oxide, and an aluminum oxide.

12. The device of claim 8, wherein a single modified layer resulting from the laser light is provided on lateral faces of the semiconductor substrate between the first face and the second face.

13. The device of claim 1, wherein the second material layer transmits of laser light, the laser light having a wavelength of 800 nanometers to 2500 nanometers.

14. The device of claim 1, wherein the second material layer is higher in a Young's modulus than the semiconductor substrate.

15. The device of claim 1, wherein the second material layer includes any of a silicon nitride film, diamond-like carbon, an yttrium oxide, a zirconium oxide, and an aluminum oxide.

16. The device of claim 1, wherein a single modified layer resulting from the laser light is provided on lateral faces of the semiconductor substrate between the first face and the second face.

17. The device of claim 16, wherein the modified layer is provided on the lateral faces substantially in parallel to outer edges of the first and second faces.

18. The device of claim 1, wherein the first material layer does not have a crystal orientation in a specific direction.

* * * * *